United States Patent
Kumar et al.

(10) Patent No.: US 11,178,751 B2
(45) Date of Patent: Nov. 16, 2021

(54) PRINTED CIRCUIT BOARD HAVING VIAS ARRANGED FOR HIGH SPEED SERIAL DIFFERENTIAL PAIR DATA LINKS

(71) Applicant: DELL PRODUCTS, LP, Round Rock, TX (US)

(72) Inventors: Vijendera Kumar, Bangalore (IN); Sanjay Kumar, Ranchi (IN); Arun R. Chada, Round Rock, TX (US); Mallikarjun Vasa, Secunderabad (IN); Bhyrav M. Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 144 days.

(21) Appl. No.: 15/923,494

(22) Filed: Mar. 16, 2018

(65) Prior Publication Data

US 2019/0289710 A1  Sep. 19, 2019

(51) Int. Cl.
| | |
|---|---|
| *H05K 1/18* | (2006.01) |
| *H05K 1/02* | (2006.01) |
| *H05K 1/11* | (2006.01) |
| *G06F 13/42* | (2006.01) |
| *H05K 3/40* | (2006.01) |

(52) U.S. Cl.
CPC ....... *H05K 1/0245* (2013.01); *G06F 13/4282* (2013.01); *H05K 1/115* (2013.01); *H05K 3/4038* (2013.01); *G06F 2213/0026* (2013.01); *G06F 2213/0032* (2013.01); *G06F 2213/0042* (2013.01); *H05K 2201/09609* (2013.01)

(58) Field of Classification Search
CPC .... H01P 3/08; H01P 3/06; H01P 5/028; H01P 1/2016; H01P 1/20345; H01L 23/5226; H05K 1/0206; H05K 1/0221; H05K 1/0222; H05K 1/0225; H05K 1/0251; H05K 1/112; H05K 1/113
USPC .......... 361/760, 761, 767, 777; 174/262–266
See application file for complete search history.

(56) References Cited

U.S. PATENT DOCUMENTS

| | | | |
|---|---|---|---|
| 7,113,540 B2 | 9/2006 | Yousef et al. | |
| 7,263,123 B2 | 8/2007 | Yousef | |
| 7,443,914 B2 | 10/2008 | Azenkot et al. | |
| 2003/0185295 A1 | 10/2003 | Yousef | |
| 2006/0232301 A1* | 10/2006 | Morlion | H05K 1/114 326/126 |
| 2014/0197899 A1* | 7/2014 | Kawai | H01P 3/08 333/5 |

(Continued)

*Primary Examiner* — Binh B Tran
(74) *Attorney, Agent, or Firm* — Larson Newman, LLP (57) ABSTRACT

A printed circuit board includes a differential signal via pairs to route differential signal between layers of the printed circuit board. A first differential signal via pair is oriented in a first orientation and a second differential signal via pair is oriented perpendicular to the first orientation. The second differential signal via pair is located such that a midpoint of a first line segment drawn between centers of first and second vias of the second differential signal pair intersects a first ray drawn from a center of a first via of the first differential signal via pair through a center of a second via of the first differential signal via pair. Further, the second differential signal via pair is located such that the midpoint of the first line segment is at a characteristic via-to-via pitch distance for the printed circuit board from the center of the second via of the first differential signal via pair.

12 Claims, 6 Drawing Sheets

(56) References Cited

U.S. PATENT DOCUMENTS

2014/0209370 A1\* 7/2014 Minich ............... H05K 1/0245
174/266
2016/0181682 A1\* 6/2016 Zhao ..................... H05K 1/111
333/5
2017/0271735 A1\* 9/2017 Kagaya .................. H01P 5/028

\* cited by examiner

PRINTED CIRCUIT BOARD HAVING VIAS ARRANGED FOR HIGH SPEED SERIAL DIFFERENTIAL PAIR DATA LINKS

FIELD OF THE DISCLOSURE

This disclosure generally relates to information handling systems, and more particularly relates to printed circuit boards having vias arranged for high speed serial differential pair data links.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A printed circuit board may include differential signal via pairs to route differential signal between layers of the printed circuit board. A first differential signal via pair may be oriented in a first orientation and a second differential signal via pair may be oriented perpendicular to the first orientation. The second differential signal via pair may be located such that a midpoint of a first line segment drawn between centers of first and second vias of the second differential signal pair intersects a first ray drawn from a center of a first via of the first differential signal via pair through a center of a second via of the first differential signal via pair. Further, the second differential signal via pair may be located such that the midpoint of the first line segment is at a characteristic via-to-via pitch distance for the printed circuit board from the center of the second via of the first differential signal via pair.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
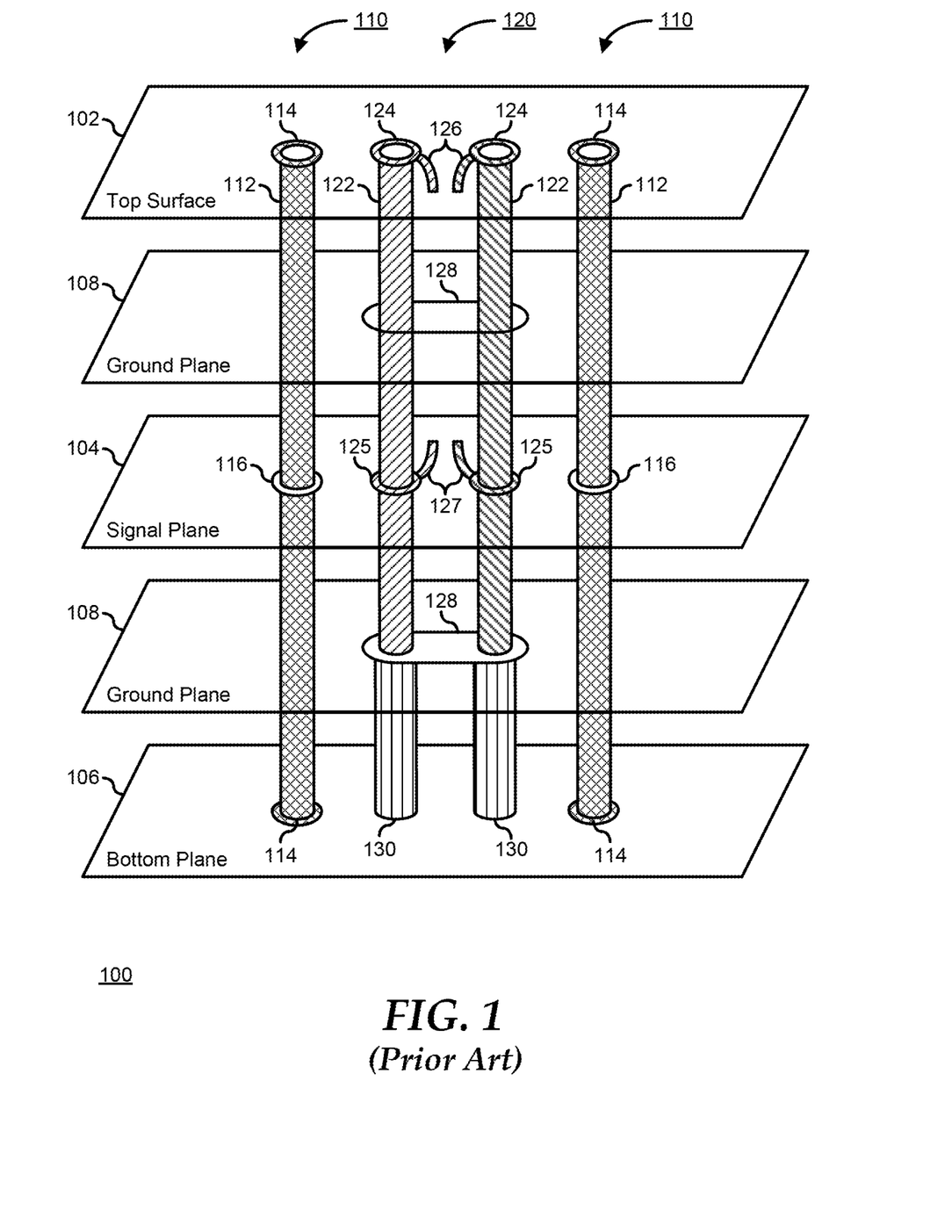
FIG. 1 illustrates a through-hole differential via arrangement on a printed circuit board (PCB) known in the prior art.

FIG. 1 illustrates a through-hole differential via arrangement on a printed circuit board (PCB) 100 known in the prior art. PCB 100 is fabricated by printing metal circuit traces on the surface of various laminate materials, such as FR-X or CEM-X families of laminate materials. A number of laminate layers are sandwiched together to form PCB 100. As illustrated, PCB 100 shows various circuit layers that are printed upon the laminate materials but does not show the actual laminate layers. Therefore it will be understood that that PCB 100 will include the associated laminate layers. FIG. 1 is not shown to a particular scale, but that the dimensions shown in FIG. 1 are for illustrative purposes only.

PCB 100 includes a top surface circuit layer 102, a signal plane circuit layer 104, a bottom surface circuit layer 106, and two ground plane circuit layers 108. Top surface circuit layer 102 and bottom surface circuit layers each include metal connector pads for mounting various electronic and electrical components to the top and bottom surfaces of PCB 100. Top surface circuit layer 102 and bottom surface circuit layer 106 also include metal circuit traces to connect the various electronic and electrical components together to provide the functionality of PCB 100 as needed or desired. The connections between the various electronic and electrical components may run along the surface of top surface circuit layer 102 and bottom surface circuit layer 106 and pass through vias to signal plane circuit layer 104 to be routed to other electronic or electrical components of PCB 100. Other vias between ground planes 108 and top surface circuit layer 102 and bottom surface circuit layer 106 may provide a ground return path to the various electronic and electrical components, as needed or desired. It will be understood that PCB 100 may include one or more additional signal plane circuit layers, one or more additional ground plane circuit layers, and one or more power plane circuit layers to provide a power path to the various electronic and electrical components, as needed or desired.

PCB 100 can include circuit paths for high speed serial differential pair data links in accordance with one or more high speed serial data communication technologies. An example of a high speed serial data communication technology includes a Universal Serial Bus (USB) data link, a Peripheral Component Interconnect—Express (PCIe) data link, a Serial-ATA (SATA) data link, a High-Definition Multimedia Interface (HDMI) data link, or another high speed serial differential pair data link, as needed or desired. As used herein, a circuit path can include connections between electronic or electrical components of PCB 100 that are routed through circuit traces that are on one or the other of top surface circuit layer 102 and bottom surface circuit layer 106, including circuits that are routed between the top or bottom surfaces and the signal plane circuit layer 104 utilizing a particular via arrangement to signal plane circuit layer 104. A circuit path can also include connections between the electronic or electrical components and ground plane circuit layers 108 and power plane circuit layers to provide operating power to the electronic or electrical components. The particular details of routing a particular circuit path on PCB 100 will vary, depending on which of the particular high speed serial data communication technologies is being utilized. As such, the details of circuit path routings are known in the art and will not be further described herein, except as needed to further illustrate the present disclosure.

PCB 100 includes ground vias 110, differential pair signal vias 120, and back-hole drilled vias 130. Ground vias 110 each include a plated through-hole 112, a ground via pad 114 on top surface circuit layer 102, a ground via pad 114 on bottom surface circuit layer 106, and a ground anti-pad 116 where the plated through-hole passes through signal plane circuit layer 104. Differential pair signal vias 120 each include a plated through-hole 122, a signal via pad 124 on top surface circuit layer 102, a signal via pad 125 on signal plane circuit layer 104, a circuit trace 126 on top surface circuit layer 102, and a signal trace 127 on signal plane circuit layer 104. Differential pair signal vias 120 share a signal anti-pad 128 on each ground plane circuit layer 108.

Differential pair signal vias 120 provide circuit structure to route the circuit paths for the associated high speed serial differential pair data links from top surface circuit layer 102 to signal plane circuit layer 104. As such, each side of the differential signal from a component mounted on top surface circuit layer 102 is connected to a respective signal trace 126 that is formed together with signal via pad 124 on the top surface of PCB 100. Signal via pads 124 are each connected to an associated plated through-hole 122, which, in turn, is connected to an associated signal via pad 125 on signal plane circuit layer 104. Each signal pad via 124 is formed together with an associated signal trace 127 which further routes the differential signal to a different location on PCB 100. PCB 100 will typically include one or more differential via arrangement similar to the illustrated differential via arrangement to return a particular high speed differential signal from signal plane circuit layer 104 to one or the other of top surface circuit layer 102 or bottom surface circuit layer 106, as needed or desired. Ground vias 110 are provided in association with differential signal vias 120 to provide a return path for unwanted signal vias injected onto the differential signal, such as through cross talk, random noise, or other unwanted signals. Back hole drilled vias 130 are provided to reduce the length of any unwanted open circuit stubs formed in the fabrication process of PCB 100, and will not be further described herein, except as needed to further illustrate the present disclosure.

In the differential via arrangement depicted in FIG. 1, it will be understood that the dimensions of pads 114, 124, and 125, the via through holes 112 and 122, and anti-pads 116 and 128, circuit traces 126 and 127, and the pitch between the vias may be specified by the manufacturing processes used to manufacture PCB 100, the various high speed serial data communication technologies, or by other considerations as needed or desired. For the purposes of further disclosure, the dimensions shown in Table 1, below, will be utilized as being typical, but it should be understood that, in the design of a particular PCB, the actual dimensions, pitches, tolerances, or other aspects of the layout, the design rules associated with the particular manufacturing processes used to manufacture the PCB, the various high speed serial data communication technologies, and other aspects of the PCB layout and design will be controlling over the typical values utilized herein.

TABLE 1

Typical Via Dimensions

| Parameter | Value (mils) |
|---|---|
| Via Diameter | 5 |
| Ground Via Pad Diameter | 10 |
| Signal Via Pad Diameter | 10 |
| Via-To-Via Pitch | 40 |

Figure 2:
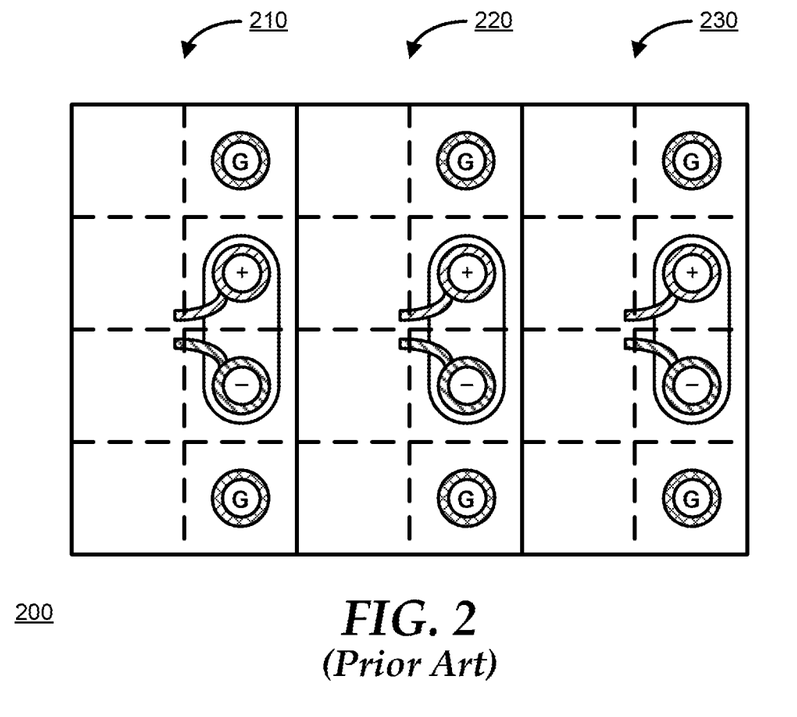
FIG. 2 illustrates a PCB with three differential pair via arrangements known in the prior art.

FIG. 2 illustrates a top view of a PCB 200 with three differential pair via arrangements 210, 220, and 230 in accordance with the prior art. Each differential pair via arrangement 210, 220 and 230 includes two ground vias and two differential signal vias. In each differential pair via arrangement 210, 220, and 230, the ground and differential signal vias are arranged in accordance with a ground-signal-signal-ground arrangement, where the centers of each of the vias are arranged in a line with the first and second ground vias located such that the axes of the ground vias form a line. The differential signal vias are then located such that the axes of the differential signal vias are on the line formed between the ground vias. The distance between the first ground via and the first differential signal via, the distance between the first differential signal vias and the second differential signal via, and the distance between the second differential signal via and the second ground via are all equal to the via-to-via pitch distance. For example, the first differential signal via of differential pair via arrangement 210 may be 40 mils from the first ground via, the second differential signal via may be 40 mils from the first differential signal via, and the second ground via may be 40 mils from the second differential signal via.

A particular design rule for placing circuit via arrangements provides that differential pair via arrangements should be places at two times (2×) the via-to-via pitch distance in order to permit sufficient distance for routing the signal traces away from the differential pair via arrangements. As such, differential pair via arrangement 220 is similar to differential pair via arrangement 210, being in a ground-signal-signal-ground arrangement that is in a line parallel to the line formed by differential pair via arrangement 210, and located at two times (2×) the via-to-via pitch distance. So, continuing the above example, differential pair via arrangement 220 is located 80 mils away from differential pair via arrangement 210. Similarly, differential pair via arrangement 230 is similar to differential pair via arrangement 210, is in a line parallel to the line formed by differential pair via arrangement 210, and is located at two times (2×) the via-to-via pitch distance from differential pair via arrangement 220. So, continuing the above example, differential pair via arrangement 230 is located 80 mils away from differential pair via arrangement 220.

For the purpose of this disclosure, a via cut-out is an area on the surface of a PCB that is needed to place a via in accordance with the particular via-to-via pitch distance, and can be visualized as a square that has sides that are equal to the via-to-via pitch distance and that is centered on the center of the via. A measure of the area that is needed to place a differential pair via arrangement on a PCB can be expressed as a number (X) of via cut-outs, that need to be reserved to place the particular differential pair via arrangement on the PCB. In the differential pair via arrangement shown in FIG. 2, each of differential pair via arrangements 210, 220, and 230 take up eight (8) via cut-outs. A measure of the spatial efficiency of a particular differential pair via arrangement can be expressed as a ratio of the number (X) of via cut-outs needed for the arrangement divided by the number of signal vias of the arrangement. Here, each of differential pair via arrangements 210, 220, and 230 take up eight (8) via cut-outs in order to provide two (2) signal vias. Hence differential pair via arrangements 210, 220, and 230 each have a spatial efficiency of 8:2, or 4:1. Note that a lower ratio indicates a more compact arrangement.

Figure 3:
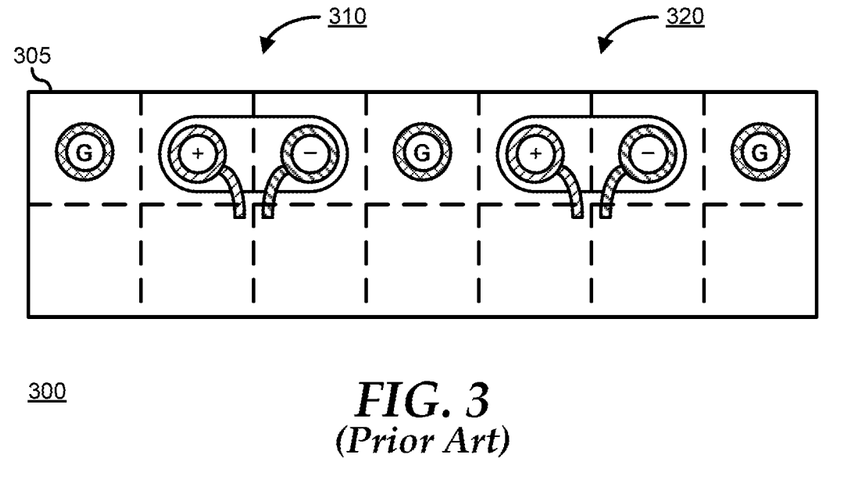
FIG. 3 illustrates a PCB with another differential pair via arrangements known in the prior art.

FIG. 3 illustrates a top view of a PCB 300 with a differential pair via arrangement 305 in accordance with the prior art. Differential pair via arrangement 305 includes three ground vias and two (2) pairs of differential signal vias 310 and 320. The ground and differential signal vias are arranged in accordance with a modified ground-signal-signal-ground arrangement, where the axes of all of the vias are arranged in a line with the first, second, and third ground vias located such that the axes of the ground vias form a line. The differential signal vias are then located such that the axes of the differential signal vias are on the line formed between the ground vias. The distance between the first ground via and a first via of differential signal vias 310, the distance between a second via of differential signal via pair 310 and the middle ground via, the distance between the middle ground via and a first via of differential signal via pair 320, and the distance between a second via of differential signal via pair 320 and the third ground via are all equal to the via-to-via pitch distance. For example, a first via of differential signal via pair 310 may be 40 mils from the first ground via, the second ground via may be 40 mils from a second via of differential signal via pair 310 and 40 mils from a first via of differential signal via pair 320, and the third ground via may be 40 mils from a second via of differential signal via pair 320. Utilizing the design rule above, differential pair via arrangement 305 takes up 14 via cut-outs in order to provide four (4) signal vias. Thus, differential pair via arrangement 305 has a spatial efficiency of 14:4, or 3.5:1. Note that differential pair via arrangement 305 can be extended by adding additional differential signal via pairs and ground vias on the same line. For example, a differential pair via arrangement with three (3) differential signal via pairs and four ground vias would take up 20 via cut-outs and have a spatial efficiency of 20:6, or 3.33:1, and a differential pair via arrangement with four (4) differential signal pairs and five ground vias would take up 26 via cut-outs and have a spatial efficiency of 26:8, or 3.25:1. Thus, it can be seen that utilizing the modified ground-signal-signal-ground arrangement of differential pair via arrangement 305 may provide greater spatial efficiency in laying out differential signal circuit paths than may be provided by differential pair via arrangements 210, 220, and 230. In addition, as discussed further, below, differential pair via arrangement 305 may provide greater cross talk isolation between differential signal via pairs 310 and 320 than may be provided between differential pair via arrangements 210 and 220, and between differential pair via arrangements 220 and 230.

Figure 4:
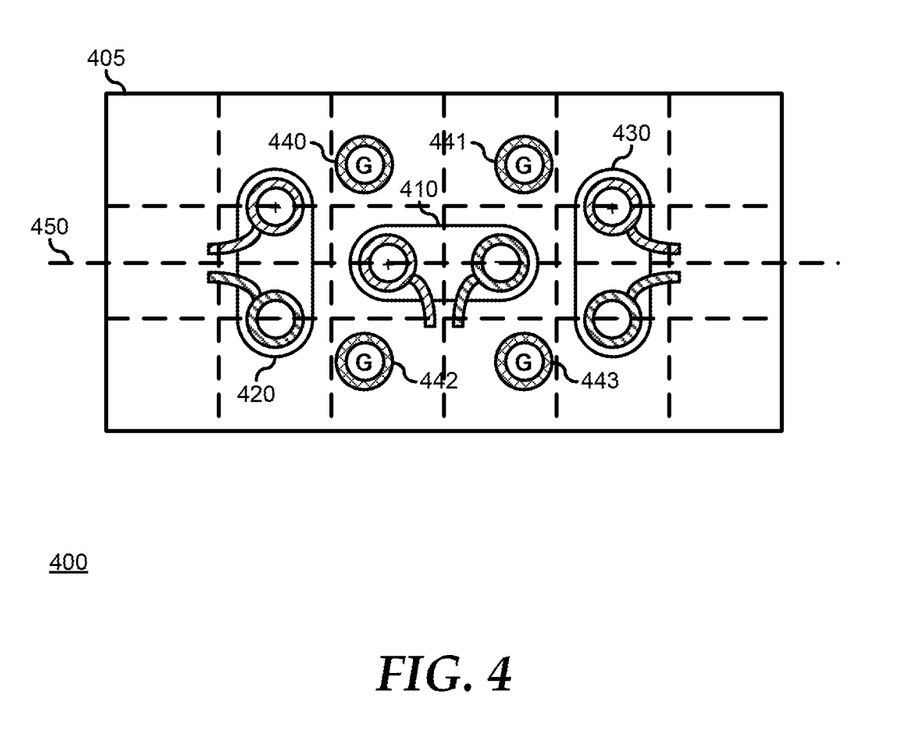
FIG. 4 illustrates a PCB with a differential pair via arrangement in accordance with an embodiment of the present disclosure.

FIG. 4 illustrates a top view of a PCB 400 with a differential pair via arrangement 405 in accordance with an embodiment of the present disclosure. Differential pair via arrangement 405 includes three (3) differential signal via pairs 410, 420, and 430, and four (4) ground vias 440-443. The description of configuring differential pair via arrangement 405 is simplified by reference to a center line 450 of the differential pair via arrangement. Differential signal via pair 410 is located such that the centers of the individual signal vias of the pair are both centered on center line 450. Differential signal via pairs 420 and 430 are oriented perpendicularly to center line 405. As such, differential signal via pair 420 is located at one times (1×) the via-to-via pitch distance from the first signal via of differential signal via pair 410. Further, the first signal via of differential signal via pair 420 is located one half (0.5×) the via-to-via pitch distance above center line 405, and the second signal via of differential signal via pair 420 is located one half (0.5×) the via-to-via pitch distance below the center line. Finally, the circuit traces of differential signal via pair 420 are routed away from differential signal via pair 410. Similarly, differential signal via pair 430 is located at one times (1×) the via-to-via pitch distance from the second signal via of differential signal via pair 410, that is, to the side of center line 450 that is opposite to the placement of differential signal via pair 420. Further, the first signal via of differential signal via pair 430 is located one half (0.5×) the via-to-via pitch distance above center line 405, and the second signal via of differential signal via pair 430 is located one half (0.5×) the via-to-via pitch distance below the center line. Finally, the circuit traces of differential signal via pair 430 are routed away from differential signal via pair 410.

Ground vias 440-443 are located such that each ground via is substantially one times (1×) the via-to-via pitch distance from one signal via of each of two different differential signal via pairs. Thus ground via 440 is located substantially one times (1×) the via-to-via pitch distance from a first signal via of differential signal via pair 410 and from a first signal via of differential signal via pair 420, ground via 441 is located substantially one times (1×) the via-to-via pitch distance from a second signal via of differential signal via pair 410 and from a first signal via of differential signal via pair 430, ground via 442 is located substantially one times (1×) the via-to-via pitch distance from the first signal via of differential signal via pair 410 and from a second signal via of differential signal via pair 420, and ground via 443 is located substantially one times (1×) the via-to-via pitch distance from the second signal via of differential signal via pair 410 and from a second signal via of differential signal via pair 430.

Utilizing the design rule above, differential pair via arrangement 405 takes up 18 via cut-outs in order to provide six (6) signal vias. Thus, differential pair via arrangement 405 has a spatial efficiency of 18:6, or 3:1. Thus, it can be seen that utilizing the arrangement of differential pair via arrangement 405 may provide greater spatial efficiency in laying out differential signal circuit paths than may be provided by any of differential pair via arrangements in PCBs 200 and 300. In addition, as discussed further, below, differential pair via arrangement 405 may provide greater cross talk isolation between differential signal via pairs 410, 420, and 430 than may any of differential pair via arrangements in PCBs 200 and 300.

Figure 5:
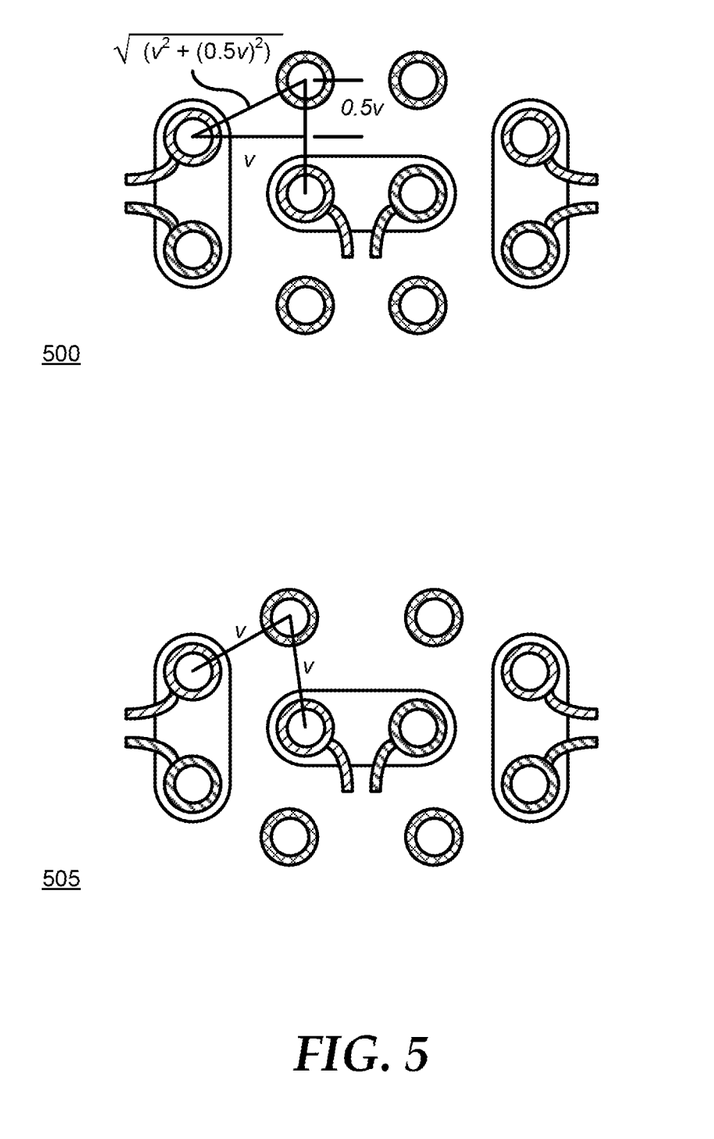
FIG. 5 illustrates ground via placements in the differential pair via of FIG. 4.

FIG. 5 illustrates various embodiments of differential pair via arrangements similar to differential pair via arrangement 405. In a first embodiment, differential via pair arrangement 500 includes that the ground vias are each located one times (1×) the via-to-via pitch distance above and below the signal vias of the central differential signal via pair, such that a line passing through the center of a first pair of ground vias also passes through the center of a first signal via of the central differential signal via pair, and that a line passing through the center of a second pair of ground vias also passes through the center of the second signal via of the central differential signal via pair. Here, the distance of each ground via to the signal via of the nearest outer differential signal via pair can be determined by Pythagorean Theorem to be substantially 1.118× the via-to-via pitch distance. In another embodiment, differential pair via arrangement 505 shows that the ground vias are each located one times (1×) the via-to-via pitch distance from the closest signal via of the central differential signal via pair, and one times (1×) the via-to-via pitch distance from the closest signal via of the closest outer differential signal via pair.

In addition to being more spatially efficient than differential pair via arrangements in PCBs 200 and 300, differential pair via arrangement 405 also provides greater immunity to cross talk between differential signal via pairs 410, 420, and 430. For example, the cross talk coupling from differential signal via pair 410 onto differential signal via pair 420 is equally injected onto the positive and negative signal vias of differential signal via pair 420 because the positive and negative signal vias are at an equal distance from the nearest signal via of differential signal via pair 410. Thus differential signal via pair 420 benefits from greater cross talk immunity from differential signal via pair 410. Differential signal via pair 430 enjoys the same benefit of greater cross talk immunity from differential signal via pair 410 based upon the fact that the positive and negative signal vias of differential signal via pair 430 are at an equal distance from the nearest signal via of differential signal via pair 410. Further, the cross talk coupling from the positive signal via of differential signal via pair 420 onto differential signal via pair 410 is equally to, but of opposite sign as the cross talk coupling from the negative signal via of differential signal via pair 420 onto differential signal via pair 410, and the same is true of cross talk injected from differential signal via pair 430 onto differential signal via pair 410. Thus differential signal via pair 410 injected by the positive and negative signal vias onto differential signal via pair 410 because the positive and negative signal vias are at an equal distance from the nearest signal via of differential signal via pair 410 benefits from greater cross talk immunity from differential signal via pairs 420 and 430.

Figure 6:
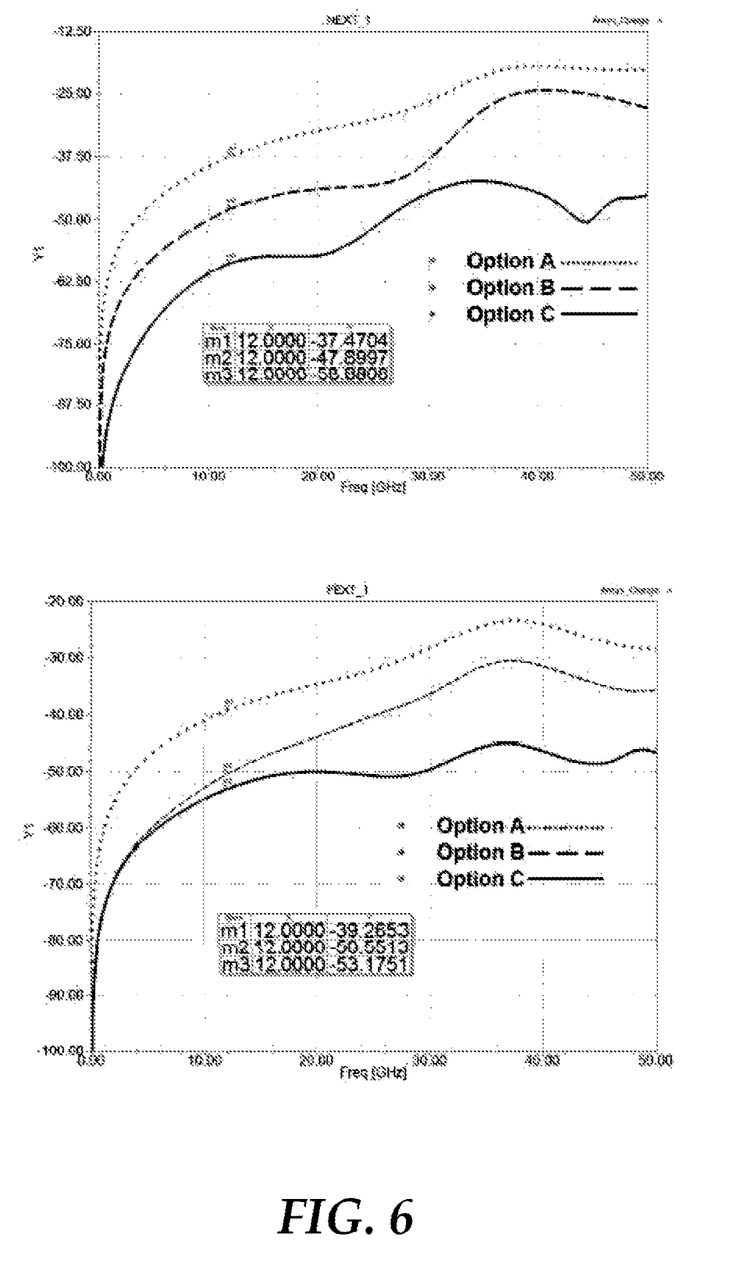
FIG. 6 illustrates the cross talk experienced by various differential pair via arrangements.

FIG. 6 compares the near end cross talk (NEXT) and the far end cross talk (FEXT) experienced by a differential sign via pair in the different differential pair via arrangements as described herein. In each case, the dotted trace labeled "A" is the cross talk experienced in a differential pair via arrangement similar to differential pair via arrangements 210, 220, and 230, the dashed trace labeled "B" is the cross talk experienced in a differential signal via pair similar to differential signal via pairs 310 and 320, and the solid trace labeled "C" is the cross talk experienced in a differential pair via arrangement similar to differential pair via arrangement 405. Note that in both the NEXT case and the FEXT case, the cross talk experienced by the differential pair via arrangement similar to differential pair via arrangement 405 is the lowest across all frequencies.

Figure 7:
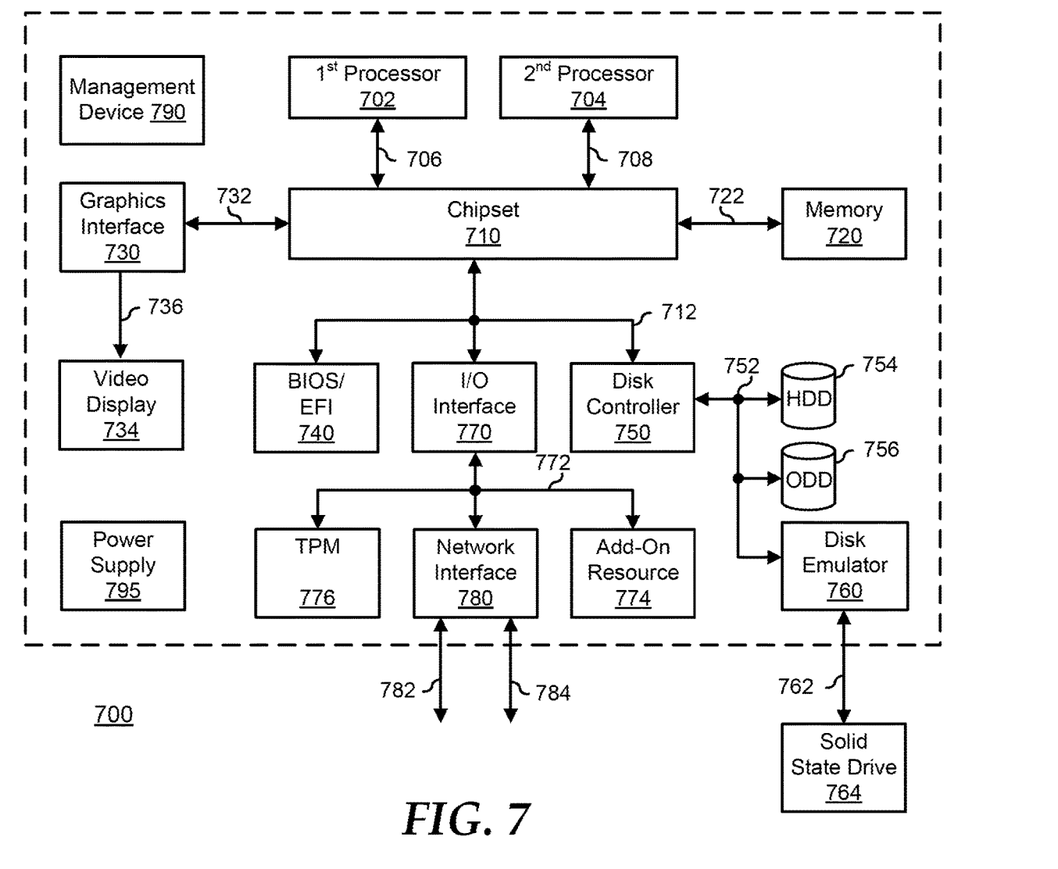
FIG. 7 is a block diagram illustrating a generalized information handling system according to an embodiment of the present disclosure.

FIG. 7 illustrates a generalized embodiment of an information handling system 700 similar to information handling system 100. For purpose of this disclosure information handling system 700 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 700 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 700 can include processing resources for executing machine-executable code, such as a central processing unit (CPU), a programmable logic array (PLA), an embedded device such as a System-on-a-Chip (SoC), or other control logic hardware. Information handling system 700 can also include one or more computer-readable medium for storing machine-executable code, such as software or data. Additional components of information handling system 700 can include one or more storage devices that can store machine-executable code, one or more communications ports for communicating with external devices, and various input and output (I/O) devices, such as a keyboard, a mouse, and a video display. Information handling system 700 can also include one or more buses operable to transmit information between the various hardware components.

Information handling system 700 can include devices or modules that embody one or more of the devices or modules described below, and operates to perform one or more of the methods described below. Information handling system 700 includes a processors 702 and 704, a chipset 710, a memory 720, a graphics interface 730, a basic input and output system/universal extensible firmware interface (BIOS/UEFI) module 740, a disk controller 750, a hard disk drive (HDD) 754, an optical disk drive (ODD) 756, a disk emulator 760 connected to an external solid state drive (SSD) 762, an input/output (I/O) interface 770, one or more add-on resources 774, a trusted platform module (TPM) 776, a network interface 780, a management device 790, and a power supply 795. Processors 702 and 704, chipset 710, memory 720, graphics interface 730, BIOS/UEFI module 740, disk controller 750, HDD 754, ODD 756, disk emulator 760, SSD 762, I/O interface 770, add-on resources 774, TPM 776, and network interface 780 operate together to provide a host environment of information handling system 700 that operates to provide the data processing functionality of the information handling system. The host environment operates to execute machine-executable code, including platform BIOS/UEFI code, device firmware, operating system code, applications, programs, and the like, to perform the data processing tasks associated with information handling system 700.

In the host environment, processor 702 is connected to chipset 710 via processor interface 706, and processor 704 is connected to the chipset via processor interface 708. Memory 720 is connected to chipset 710 via a memory bus 722. Graphics interface 730 is connected to chipset 710 via a graphics interface 732, and provides a video display output 736 to a video display 734. In a particular embodiment, information handling system 700 includes separate memories that are dedicated to each of processors 702 and 704 via separate memory interfaces. An example of memory 720 includes random access memory (RAM) such as static RAM (SRAM), dynamic RAM (DRAM), non-volatile RAM (NV-RAM), or the like, read only memory (ROM), another type of memory, or a combination thereof.

BIOS/UEFI module 740, disk controller 750, and I/O interface 770 are connected to chipset 710 via an I/O channel 712. An example of I/O channel 712 includes a Peripheral Component Interconnect (PCI) interface, a PCI-Extended (PCI-X) interface, a high speed PCI-Express (PCIe) interface, another industry standard or proprietary communication interface, or a combination thereof. Chipset 710 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 740 includes BIOS/UEFI code operable to detect resources within information handling system 700, to provide drivers for the resources, initialize the resources, and access the resources. BIOS/UEFI module 740 includes code that operates to detect resources within information handling system 700, to provide drivers for the resources, to initialize the resources, and to access the resources.

Disk controller 750 includes a disk interface 752 that connects the disk controller to HDD 754, to ODD 756, and to disk emulator 760. An example of disk interface 752 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 760 permits SSD 764 to be connected to information handling system 700 via an external interface 762. An example of external interface 762 includes a USB interface, an IEEE 1394 (Firewire) interface, a proprietary interface, or a combination thereof. Alternatively, solid-state drive 764 can be disposed within information handling system 700.

I/O interface 770 includes a peripheral interface 772 that connects the I/O interface to add-on resource 774, to TPM 776, and to network interface 780. Peripheral interface 772 can be the same type of interface as I/O channel 712, or can be a different type of interface. As such, I/O interface 770 extends the capacity of I/O channel 712 when peripheral interface 772 and the I/O channel are of the same type, and the I/O interface translates information from a format suitable to the I/O channel to a format suitable to the peripheral channel 772 when they are of a different type. Add-on resource 774 can include a data storage system, an additional graphics interface, a network interface card (NIC), a sound/video processing card, another add-on resource, or a combination thereof. Add-on resource 774 can be on a main circuit board, on separate circuit board or add-in card disposed within information handling system 700, a device that is external to the information handling system, or a combination thereof.

Network interface 780 represents a NIC disposed within information handling system 700, on a main circuit board of the information handling system, integrated onto another component such as chipset 710, in another suitable location, or a combination thereof. Network interface device 780 includes network channels 782 and 784 that provide interfaces to devices that are external to information handling system 700. In a particular embodiment, network channels 782 and 784 are of a different type than peripheral channel 772 and network interface 780 translates information from a format suitable to the peripheral channel to a format suitable to external devices. An example of network channels 782 and 784 includes InfiniBand channels, Fibre Channel channels, Gigabit Ethernet channels, proprietary channel architectures, or a combination thereof. Network channels 782 and 784 can be connected to external network resources (not illustrated). The network resource can include another information handling system, a data storage system, another network, a grid management system, another suitable resource, or a combination thereof.

Management device 790 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 700. In particular, management device 790 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 700, such as system cooling fans and power supplies. Management device 790 can include a network connection to an external management system, and the management device can communicate with the management system to report status information for information handling system 700, to receive BIOS/UEFI or system firmware updates, or to perform other task for managing and controlling the operation of information handling system 700. Management device 790 can operate off of a separate power plane from the components of the host environment so that the management device receives power to manage information handling system 700 when the information handling system is otherwise shut down. An example of management device 790 may include a commercially available BMC product that operates in accordance with an Intelligent Platform Management Initiative (IPMI) specification, such as a Integrated Dell Remote Access Controller (iDRAC), or the like. Management device 790 may further include associated memory devices, logic devices, security devices, or the like, as needed or desired.

Power supply 795 represents one or more devices for power distribution to the components of information handling system 700. In particular, power supply 795 can include a main power supply that receives power from an input power source, such as a wall power outlet, a power strip, a battery, or another power source, as needed or desired. Here, power source 795 operates to convert the power at a first voltage level from the input power source to one or more power rails that are utilized by the components of information handling system. Power supply 795 can also include one or more voltage regulators (VRs) that each receive power from the main power supply and that operate to convert the input voltage to an output voltage that is used by one or more components of information handling system. For example, a VR can be provided for each of processors 702 and 704, and another VR can be provided for memory 720. Power supply 795 can be configured to provide a first power plane that provides power to the host environment, and to provide a second power plane that provides power to the management environment.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A printed circuit board, comprising:
   a first differential signal via pair to route a first differential signal from a first layer of the printed circuit board to a second layer of the printed circuit board, wherein first and second vias of the first differential signal via pair are spaced apart from each other at a first characteristic via-to-via pitch distance for the printed circuit board;
   a second differential signal via pair to route a second differential signal from the first layer to the second layer wherein first and second vias of the second differential signal via pair are spaced apart from each other at the first characteristic via-to-via pitch distance, the first differential signal via pair is oriented on the printed circuit board in a first orientation, the second differential signal via pair is oriented on the printed circuit board in a second orientation that is perpendicular to the first orientation, the second differential signal via pair is located such that a midpoint of a first line segment drawn between centers of the first and second vias of the second differential signal pair intersects a first ray drawn from a center of the first via of the first differential signal via pair through a center of the second via of the first differential signal via pair, and the second differential signal via pair is further located such that the midpoint of the first line segment is at the first characteristic via-to-via pitch distance from the center of the second via of the first differential signal via pair;
   a third differential signal via pair to route a third differential signal from the first layer to the second layer wherein the third differential signal via pair is oriented on the printed circuit board in a third orientation that is perpendicular to the first orientation, the third differential signal via pair is located such that a midpoint of a second line segment drawn between centers of first and second vias of the third differential signal pair intersects a second ray drawn from the center of the second via of the first differential signal via pair through the center of the first via of the first differential signal via pair, and the third differential signal via pair is further located such that the midpoint of the third line segment is at the characteristic via-to-via pitch distance from the center of the first via of the first differential signal via pair;
   a first ground via located such that a center of the first ground via is at the first characteristic via-to-via pitch distance from the center of the second via of the first differential signal via pair and at a second characteristic via-to-via pitch distance from the first via of the second differential signal via pair, and is located to a first side of the first ray, wherein the first characteristic via-to-via pitch distance is shorter than the second characteristic via-to-via pitch distances; and
   a second ground via located such that a center of the second ground via is at the first characteristic via-to-via pitch distance from the center of the second via of the first differential signal via pair and at the second characteristic via-to-via pitch distance from the second via of the second differential signal via pair, and is located to a second side of the first ray, wherein the first, second, and third differential signal via pairs have a spatial efficiency of 3:1.

2. The printed circuit board of claim 1, further comprising:
   a third ground via located such that a center of the third ground via is at the second characteristic via-to-via pitch distance from the center of the first via of the first differential signal via pair and at the second characteristic via-to-via pitch distance from the first via of the third differential signal via pair, and is located to a first side of the second ray; and
   a fourth ground via located such that a center of the fourth ground via is at the second characteristic via-to-via pitch distance from the center of the first via of the first differential signal via pair and at the second characteristic via-to-via pitch distance from the second via of the third differential signal via pair, and is located to a second side of the second ray.

3. The printed circuit board of claim 1, further comprising:
   a first pair of circuit traces on the first layer, the first pair of circuit traces coupled between a first device and the first differential signal via pair to communicate the first differential signal from the first device to the first differential signal via pair; and
   a second pair of circuit traces on the first layer, the second pair of circuit traces coupled between the first device and the second differential signal via pair to communicate the second differential signal from the first device to the second differential signal via pair.

4. The printed circuit board of claim 3, further comprising:
   a third pair of circuit traces on the second layer, the third pair of circuit traces coupled between the first differential signal via pair and a second device to communicate the first differential signal from the first differential signal via pair to the second device; and
   a fourth pair of circuit traces on the second layer, the fourth pair of circuit traces coupled between the second differential signal via pair and the second device to communicate the second differential signal from the second differential signal via pair to the second device.

5. The printed circuit board of claim 1, wherein the first and second differential signals are high speed serial differential pair data links.

6. The printed circuit board of claim 5, wherein the high speed serial differential pair data link includes one of a Universal Serial Bus data link, a Peripheral Component Interconnect-Express data link, a Serial-ATA data link, and a High-Definition Multimedia Interface data link.

7. An information handling system, comprising:
a processor; and
a printed circuit board including:
- a first differential signal via pair to route a first differential signal from a first layer of the printed circuit board to a second layer of the printed circuit board, wherein first and second vias of the first differential signal via pair are spaced apart from each other at a first characteristic via-to-via pitch distance for the printed circuit board; and
- a second differential signal via pair to route a second differential signal from the first layer to the second layer wherein first and second vias of the second differential signal via pair are spaced apart from each other at the first characteristic via-to-via pitch distance, the first differential signal via pair is oriented on the printed circuit board in a first orientation, the second differential signal via pair is oriented on the printed circuit board in a second orientation that is perpendicular to the first orientation, the second differential signal via pair is located such that a midpoint of a first line segment drawn between centers of the first and second vias of the second differential signal pair intersects a first ray drawn from a center of the first via of the first differential signal via pair through a center of the second via of the first differential signal via pair, and the second differential signal via pair is further located such that the midpoint of the first line segment is at the characteristic via-to-via pitch distance from the center of the second via of the first differential signal via pair;
- a third differential signal via pair to route a third differential signal from the first layer to the second layer wherein the third differential signal via pair is oriented on the printed circuit board in a third orientation that is perpendicular to the first orientation, the third differential signal via pair is located such that a midpoint of a second line segment drawn between centers of first and second vias of the third differential signal pair intersects a second ray drawn from the center of the second via of the first differential signal via pair through the center of the first via of the first differential signal via pair, and the third differential signal via pair is further located such that the midpoint of the third line segment is at the characteristic via-to-via pitch distance from the center of the first via of the first differential signal via pair;
- a first ground via located such that a center of the first ground via is at the first characteristic via-to-via pitch distance from the center of the second via of the first differential signal via pair and at a second characteristic via-to-via pitch distance from the first via of the second differential signal via pair, and is located to a first side of the first ray, wherein the first characteristic via-to-via pitch distance is shorter than the second characteristic via-to-via pitch distance; and
- a second ground via located such that a center of the second ground via is at the first characteristic via-to-via pitch distance from the center of the second via of the first differential signal via pair and at the second characteristic via-to-via pitch distance from the second via of the second differential signal via pair, and is located to a second side of the first ray, wherein the first, second, and third differential signal via pairs have a spatial efficiency of 3:1.

8. The information handling system of claim 7, the printed circuit board further comprising:
- a third ground via located such that a center of the third ground via is at the second characteristic via-to-via pitch distance from the center of the first via of the first differential signal via pair and at the second characteristic via-to-via pitch distance from the first via of the third differential signal via pair, and is located to a first side of the second ray; and
- a fourth ground via located such that a center of the fourth ground via is at the second characteristic via-to-via pitch distance from the center of the first via of the first differential signal via pair and at the second characteristic via-to-via pitch distance from the second via of the third differential signal via pair, and is located to a second side of the second ray.

9. The information handling system of claim 7, the printed circuit board further comprising:
- a first pair of circuit traces on the first layer, the first pair of circuit traces coupled between a first device and the first differential signal via pair to communicate the first differential signal from the first device to the first differential signal via pair; and
- a second pair of circuit traces on the first layer, the second pair of circuit traces coupled between the first device and the second differential signal via pair to communicate the second differential signal from the first device to the second differential signal via pair.

10. The information handling system of claim 9, the printed circuit board further comprising:
- a third pair of circuit traces on the second layer, the third pair of circuit traces coupled between the first differential signal via pair and a second device to communicate the first differential signal from the first differential signal via pair to the second device; and
- a fourth pair of circuit traces on the second layer, the fourth pair of circuit traces coupled between the second differential signal via pair and the second device to communicate the second differential signal from the second differential signal via pair to the second device.

11. The information handling system of claim 7, wherein the first and second differential signals are high speed serial differential pair data links.

12. The information handling system of claim 11, wherein the high speed serial differential pair data link includes one of a Universal Serial Bus data link, a Peripheral Component Interconnect-Express data link, a Serial-ATA data link, and a High-Definition Multimedia Interface data link.

* * * * *